United States Patent
Tsuji et al.

(10) Patent No.: US 7,442,627 B2
(45) Date of Patent: Oct. 28, 2008

(54) TRANSPARENT CONDUCTIVE LAYER FORMING METHOD, TRANSPARENT CONDUCTIVE LAYER FORMED BY THE METHOD, AND MATERIAL COMPRISING THE LAYER

(75) Inventors: Toshio Tsuji, Tokyo (JP); Hiroto Itoh, Tokyo (JP); Takakazu Kiyomura, Tokyo (JP)

(73) Assignee: Konica Corporation, Tokyo (JP)

( * ) Notice: Subject to any disclaimer, the term of this patent is extended or adjusted under 35 U.S.C. 154(b) by 216 days.

(21) Appl. No.: 11/536,910

(22) Filed: Sep. 29, 2006

(65) Prior Publication Data

US 2007/0036914 A1 Feb. 15, 2007

Related U.S. Application Data

(62) Division of application No. 10/301,912, filed on Nov. 22, 2002, now abandoned.

(30) Foreign Application Priority Data

Dec. 3, 2001 (JP) .............................. 2001-368412

(51) Int. Cl.
  *C23C 14/34* (2006.01)
  *C23C 14/08* (2006.01)
  *H01L 21/20* (2006.01)
  *H01L 21/36* (2006.01)
(52) U.S. Cl. ............................ 438/485; 438/57; 438/87; 438/96
(58) Field of Classification Search ................... 438/57, 438/87, 97, 485; 430/30
See application file for complete search history.

(56) References Cited

U.S. PATENT DOCUMENTS

| 5,225,273 | A | * | 7/1993 | Mikoshiba et al. | .......... 428/323 |
| 5,439,574 | A | * | 8/1995 | Kobayashi et al. | ..... 204/192.12 |
| 5,849,108 | A | * | 12/1998 | Kariya et al. | ............... 136/265 |
| 6,077,403 | A | * | 6/2000 | Kobayashi et al. | ..... 204/192.12 |
| 6,107,116 | A | * | 8/2000 | Kariya et al. | ................. 438/87 |
| 6,248,219 | B1 | * | 6/2001 | Wellerdieck et al. | ... 204/192.12 |
| 6,265,288 | B1 | * | 7/2001 | Okamoto et al. | ............ 438/485 |
| 6,369,871 | B1 | | 4/2002 | Hanada et al. | |
| 6,759,100 | B2 | * | 7/2004 | Fukuda et al. | .............. 427/569 |
| 6,835,425 | B2 | * | 12/2004 | Fukuda et al. | .............. 427/569 |

FOREIGN PATENT DOCUMENTS

JP 2000273636 10/2000

(Continued)

OTHER PUBLICATIONS

XP9006955 R. Moss, et al—Modified Plasma CVD in Atmospheric Environment pp. 1467-1474.

(Continued)

*Primary Examiner*—Michael S Lebentritt
(74) *Attorney, Agent, or Firm*—Lucas & Mercanti, LLP

(57) ABSTRACT

A transparent conductive layer forming method is disclosed which comprises the steps of introducing a reactive gas to a discharge space, exciting the reactive gas in a plasma state by discharge at atmospheric pressure or at approximately atmospheric pressure, and exposing a substrate to the reactive gas in a plasma state to form a transparent conductive layer on the substrate, wherein the reactive gas comprises a reducing gas.

9 Claims, 6 Drawing Sheets

FOREIGN PATENT DOCUMENTS

| | | |
|---|---|---|
| JP | 2000355772 | 12/2000 |
| JP | 2001271167 | 9/2006 |
| WO | 9920809 | 4/1999 |

OTHER PUBLICATIONS

XP000358824—Bruce Mayer—Highly Conductive and Transparent Films on Tin and Fluorine Doped Indium Oxide Produced by APCVD—pp. 166-182.

European Search Report EP 02 02 6492.

B. Szyszka—Thin Solid Films 351 (1999) pp. 164-169.

T. Minami, et al—Thin Solid Films 366 (2000) 63-68.

Z. Zhaochun, et al—Materials Science and Engineering B86 (2001) 109-112.

T. Minami, et al—Thin Solid Films 317 (1998) 326-329.

* cited by examiner

TRANSPARENT CONDUCTIVE LAYER FORMING METHOD, TRANSPARENT CONDUCTIVE LAYER FORMED BY THE METHOD, AND MATERIAL COMPRISING THE LAYER

CROSS REFERENCE TO RELATED APPLICATIONS

This is a Divisional of U.S. patent application Ser. No. 10/301,912 filed Nov. 22, 2002, now abandoned, which, in turn, claimed the priority of Japanese Patent Application No. 2001-368412 filed Dec. 3, 2001. The priority of both Applications are hereby claimed and both Applications are incorporated herein by reference.

FIELD OF THE INVENTION

The present invention relates to a method of forming a transparent conductive layer suitably used for various electronic elements such as a liquid crystal displaying element, an organic electroluminescence element (hereinafter referred to as an organic EL element), a plasma display panel (hereinafter referred to as PDP), an electronic paper, a touch panel and a solar battery, a transparent conductive layer formed according to the method, and a material comprising the transparent conductive layer.

BACKGROUND OF THE INVENTION

The transparent conductive layer has been widely used, for example, in a liquid crystal displaying element, an organic EL element, a solar battery, a touch panel, an electromagnetic radiation shielding material, and an infrared ray reflection film. Examples of the transparent conductive layer include a layer of metal such as Pt, Au, Ag or Cu, a layer of an oxide or a complex oxide doped with a dopant such as $SnO_2$, $In_2O_3$, CdO, ZnO, $SnO_2$:Sb, $SnO_2$:F, ZnO:Al, or $In_2O_3$:Sn, and a layer of a nonoxide such as chalcogenide, LaBe, TiN, or TiC. Of these, a layer of a tin doped indium oxide (hereinafter referred to also as ITO) has been widely used in its excellent electric properties or its ease of processability such as etching. These layers are formed according to a vacuum evaporation method, a sputtering method, an ion plating method, a vacuum plasma CVD method, a spray pyrolysis method, a thermal CVD method or a sol-gel method.

In recent years, a flat panel display employing a liquid crystal device or an organic EL element with a large area and high precision has been developed, and a transparent conductive layer with high performance is required. In order to obtain an element or apparatus with quick response to electric field in the liquid crystal device, a transparent conductive layer with high mobility of electrons is required. Since an electric current driving method is applied in the organic EL element, a transparent conductive layer with lower resistivity is required.

A vacuum deposition method or sputtering method of the transparent conductive layer forming methods provides a transparent conductive layer with lower resistivity. Industrially, a DC magnetron sputtering apparatus provides an ITO layer with high conductivity having a resistivity of approximately $10^{-4}$ Ω·cm order.

However, these physical vapor deposition methods (PVD method) form a layer by depositing a predetermined material on a substrate in a vapor phase, and require a vacuum chamber. Accordingly, an apparatus employing the methods is large, expensive, and poor in efficiency in use of materials, resulting in low productivity. Further, it is difficult to manufacture a large sized layer employing the apparatus. Since it is necessary to heat a substrate at 200 to 300° C. in order to form on the substrate a transparent conductive layer with low resistivity, it is difficult to form a transparent conductive layer with low resistivity on a plastic substrate as the substrate.

In the sol-gel method (coating method), many procedures such as preparation of a dispersion solution, coating and drying are necessary to form a layer. Further, adhesion of the formed layer to a substrate is low, and a binder resin is necessary, which lowers transparency of the product. Further, electric properties of the resulting transparent conductive layer are poor as compared with those of the layer obtained by a PVD method.

The thermal CVD method is a method in which a precursor of a coated substance is coated on a substrate according to a spin coat method, a dip coat method, or a printing method, and baked (thermally decomposed) to form a layer. This method has advantages in that a device used is simple, productivity is excellent, and a layer of a large area can be easily formed, but has problem in that a substrate used is limited, since it requires baking treatment at a high temperature of from 400 to 500° C. It is difficult to form a layer particularly on a plastic film substrate.

As a method for overcoming the demerits in that the sol-gel method (coating method) is difficult to provide a layer with high function or use of the vacuum chamber results in lowering of productivity, a method is proposed which comprises subjecting a reactive gas to discharge treatment at atmospheric pressure or approximately atmospheric pressure, exciting the reactive gas to a plasma state and forming a layer on a substrate (hereinafter referred to also as an atmospheric pressure plasma CVD method). Japanese Patent O.P.I. Publication No. 2000-303175 discloses technique which forms a transparent conductive layer employing the atmospheric pressure plasma CVD method. However, the formed transparent conductive layer has a high resistivity, approximately $10^{-2}$ Ω·cm, which is insufficient as a transparent conductive layer for a flat panel display of a liquid crystal device, an organic EL element, a PDP or an electronic paper, the transparent conductive layer being required to have a resistivity of not more than $10^{-3}$ Ω·cm. Further, the CVD method employs, as a material, triethylindium, which may ignite and explode at ordinary temperature in ambient air, and therefore, has a question of safety.

SUMMARY OF THE INVENTION

The present inventors have made an extensive study on a transparent conductive layer, and as a result, have found that a transparent conductive layer with good optical and electric properties can be formed with a high productivity according to an atmospheric pressure plasma CVD method employing a reducing reactive gas as a reactive gas.

An object of the invention is to provide a method of forming a transparent conductive layer with good optical and electric properties, a method of forming a transparent conductive layer with good critical radius of curvature on a substrate, and a method of forming a transparent conductive layer with high safety and with high productivity. Another object of the invention is to provide a transparent conductive layer formed according to the above-mentioned method and a material comprising the transparent conductive layer.

DETAILED DESCRIPTION OF THE INVENTION

Figure 1:
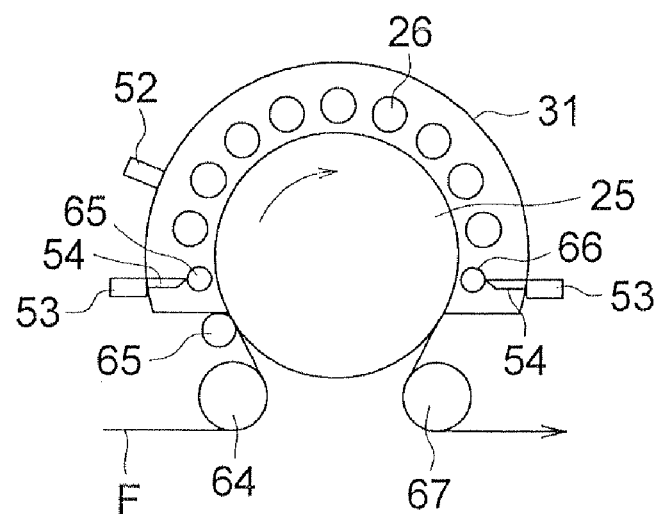
FIG. 1 shows a schematic drawing of one embodiment of the plasma discharge vessel equipped in a plasma discharge apparatus used in the manufacturing method in the invention.

The above object of the invention can be attained by each of the following constitutions:

1. A transparent conductive layer forming method comprising the steps of introducing a reactive gas to a discharge space, exciting the reactive gas in a plasma state by discharge at atmospheric pressure or at approximately atmospheric pressure, and exposing a substrate to the reactive gas in a plasma state to form a transparent conductive layer on the substrate, wherein the reactive gas comprises a reducing gas.

2. The transparent conductive layer forming method of item 1 above, wherein the reducing gas is hydrogen.

3. The transparent conductive layer forming method of item 1 above, wherein the reactive gas comprises at least one gas selected from gases derived from organometallic compounds.

4. The transparent conductive layer forming method of item 1 above, wherein the method comprises the step of introducing a mixed gas of the reactive gas and inert gas to the discharge space, the inert gas comprising argon or helium.

5. The transparent conductive layer forming method of item 4 above, wherein the content of the reducing gas in the mixed gas is 0.0001 to 5.0% by volume.

6. The transparent conductive layer forming method of item 4 above, wherein the mixed gas to be introduced to the discharge space contains no oxygen.

7. The transparent conductive layer forming method of item 1 above, wherein an output density of not more than 100 W/cm$^2$ is applied at a frequency of not less than 0.5 kHz across the discharge space.

8. The transparent conductive layer forming method of item 7 above, wherein an output density of not less than 1 W/cm$^2$ is applied at a frequency exceeding 100 kHz across the discharge space.

9. The transparent conductive layer forming method of item 1 above, wherein temperature of the surface of the substrate, on which the transparent conductive layer is formed, is not more than 300° C.

10. A transparent conductive layer, wherein the transparent conductive layer is formed on a substrate by introducing a reactive gas to a discharge space, exciting the reactive gas in a plasma state by discharge at atmospheric pressure or at approximately atmospheric pressure, and exposing the substrate to the reactive gas in a plasma state, wherein the reactive gas comprises a reducing gas.

11. The transparent conductive layer of item 10 above, wherein the transparent conductive layer has a resistivity of not more than $1\times10^{-3}$ Ω·cm.

12. The transparent conductive layer of item 10 above, having a mobility of carrier of not less than 10 cm$^2$/V·sec.

13. The transparent conductive layer of item 10 above, wherein the transparent conductive layer has a density of carrier of not less than $1\times10^{19}$ cm$^{-3}$.

14. The transparent conductive layer of item 10 above, having a density of carrier of not less than $1\times10^{20}$ cm$^{-3}$.

15. The transparent conductive layer of item 10 above, wherein the transparent conductive layer contains any of indium oxide, tin oxide, zinc oxide, fluorine doped tin oxide, aluminum doped zinc oxide, antimony doped tin oxide, ITO, and $In_2O_3$—ZnO as the main component.

16. The transparent conductive layer of item 15 above, wherein the transparent conductive layer is an ITO layer having an atomic ratio In/Sn of from 100/0.1 to 100/15.

17. The transparent conductive layer of item 15 above, wherein the transparent conductive layer has a carbon content of from 0 to 5.0 atomic %.

18. A material comprising a substrate and provided thereon, a transparent conductive layer, wherein the transparent conductive layer has a resistivity of not more than $1\times10^{-3}$ Ω·cm.

19. The material of item 18 above, wherein the transparent conductive layer has a mobility of carrier of not less than 10 cm$^2$/V·sec.

20. The material of item 18 above, wherein the transparent conductive layer has a density of carrier of not less than $1\times10^{19}$ cm$^{-3}$.

21. The material of item 18 above, wherein the transparent conductive layer has a density of carrier of not less than $1\times10^{20}$ cm$^{-3}$.

22. The material of item 18 above, wherein the transparent conductive layer contains any of indium oxide, tin oxide, zinc oxide, fluorine doped tin oxide, aluminum doped zinc oxide, antimony doped tin oxide, ITO, and $In_2O_3$—ZnO as the main component.

23. The material of item 22 above, wherein the transparent conductive layer is an ITO layer having an atomic ratio In/Sn of from 100/0.1 to 100/15.

24. The material of item 22 above, wherein the transparent conductive layer has a carbon content of from 0 to 5.0 atomic %.

25. The material of item 22 above, wherein the substrate is a transparent resin film.

26. The material of item 25 above, wherein the transparent resin film is a substrate for a touch panel, a substrate for a liquid crystal element, a substrate for an organic EL element, a substrate for a PDP, a substrate for an electromagnetic wave shielding material, or a substrate for an electronic paper.

27. The material of item 18 above, wherein the critical radius of curvature of the transparent conductive layer is not more than 8 mm.

28. The material of item 22 above, wherein the transparent conductive layer is an electrode formed by patterning.

29. A material comprising a substrate and provided thereon, a transparent conductive layer, wherein the transparent conductive layer has a coefficient of variation of the ratio H/M in the thickness direction of not more than 5%, wherein H represents peak intensity of a hydrogen ion in the thickness direction of the transparent conductive layer measured according to dynamic SIMS, and M represents peak intensity of a metal ion derived from the main metal oxide in the thickness direction of the transparent conductive layer measured according to dynamic SIMS.

30. The material of item 29 above, wherein the transparent conductive layer is formed on a substrate by introducing a reactive gas to a discharge space, exciting the reactive gas in a plasma state by discharge at atmospheric pressure or at approximately atmospheric pressure, and exposing the substrate to the reactive gas in a plasma state.

31. The material of claim 30 above, wherein the reactive gas comprises a reducing gas.

32. The material of item 30 above, wherein an output density of not less than 1 $W/cm^2$ is applied at a frequency exceeding 100 kHz across the discharge space.

101. A transparent conductive layer forming method comprising the steps of introducing a reactive gas to a discharge space, exciting the reactive gas in a plasma state by discharge at atmospheric pressure or at approximately atmospheric pressure, and exposing a substrate to the reactive gas in a plasma state to form a transparent conductive layer on the substrate, wherein the reactive gas comprises a reducing gas.

102. The transparent conductive layer forming method of item 101 above, wherein the reducing gas is hydrogen.

103. The transparent conductive layer forming method of item 101 or 102 above, wherein the reactive gas comprises at least one gas selected from gases derived from organometallic compounds.

104. The transparent conductive layer forming method of any one of items 101 through 103 above, wherein the method comprises the step of introducing a mixed gas of the reactive gas and inert gas to the discharge space, the inert gas comprising argon or helium.

105. The transparent conductive layer forming method of item 104 above, wherein the content of the reducing gas in the mixed gas is 0.0001 to 5.0% by volume.

106. The transparent conductive layer forming method of item 104 or 105 above, wherein the mixed gas to be introduced to the discharge space contains no oxygen.

107. The transparent conductive layer forming method of any one of items 101 through 104 above, wherein an output density of not more than 100 $W/cm^2$ is applied at a frequency of not less than 0.5 kHz across the discharge space.

108. The transparent conductive layer forming method of item 107 above, wherein an output density of not less than 1 $W/cm^2$ is applied at a frequency exceeding 100 kHz across the discharge space.

109. The transparent conductive layer forming method of any one of items 101 through 108 above, wherein temperature of the surface of the substrate, on which the transparent conductive layer is formed, is not more than 300° C.

110. A transparent conductive layer formed according to the transparent conductive layer forming method of any one of items 101 through 109 above.

111. The transparent conductive layer of item 110, wherein the transparent conductive layer has a resistivity of not more than $1 \times 10^{-3}$ $\Omega \cdot cm$.

112. The transparent conductive layer of item 110 or 111 above, having a mobility of carrier of not less than 10 $cm^2/V \cdot sec$.

113 The transparent conductive layer of any one of items 110 through 112 above, wherein the transparent conductive layer has a density of carrier of not less than $1 \times 10^{19}$ $cm^{-3}$.

114. The transparent conductive layer of any one of items 110 through 113 above, having a density of carrier of not less than $1 \times 10^{20}$ $cm^{-3}$.

115. The transparent conductive layer of any one of items 110 through 114 above, wherein the transparent conductive layer contains any of indium oxide, tin oxide, zinc oxide, fluorine doped tin oxide, aluminum doped zinc oxide, antimony doped tin oxide, ITO, and $In_2O_3$—ZnO as the main component.

116. The transparent conductive layer of item 115 above, wherein the transparent conductive layer is an ITO layer having an atomic ratio In/Sn of from 100/0.1 to 100/15.

117. The transparent conductive layer of item 115 or 116 above, wherein the transparent conductive layer has a carbon content of from 0 to 5.0 atomic %.

118. A material comprising a substrate and provided thereon, a transparent conductive layer, wherein the transparent conductive layer has a resistivity of not more than $1 \times 10^{-3}$ $\Omega \cdot cm$.

119. The material of item 118 above, wherein the transparent conductive layer has a mobility of carrier of not less than 10 $cm^2/V \cdot sec$.

120. The material of any one of item 118 or 119 above, wherein the transparent conductive layer has a density of carrier of not less than $1 \times 10^{19}$ $cm^{-3}$.

121. The material of any one of items 118 through 120 above, wherein the transparent conductive layer has a density of carrier of not less than $1 \times 10^{20}$ $cm^{-3}$.

122. The material of any one of items 118 through 121 above, wherein the transparent conductive layer contains any of indium oxide, tin oxide, zinc oxide, fluorine doped tin oxide, aluminum doped zinc oxide, antimony doped tin oxide, ITO, and $In_2O_3$—ZnO as the main component.

123. The material of item 122 above, wherein the transparent conductive layer is an ITO layer having an atomic ratio In/Sn of from 100/0.1 to 100/15.

124. The material of item 122 or 123 above, wherein the transparent conductive layer has a carbon content of from 0 to 5.0 atomic %.

125. The material of any one of items 122 through 124 above, wherein the substrate is a transparent resin film.

126. The material of item 125, wherein the transparent resin film is a substrate for a touch panel, a substrate for a liquid crystal element, a substrate for an organic EL element, a substrate for a PDP electromagnetic wave shielding material, or a substrate for an electronic paper.

127. The material of any one of items 118 through 126 above, wherein the critical radius of curvature of the transparent conductive layer is not more than 8 mm.

128. The material of any one of items 122 through 127 above, wherein the transparent conductive layer is an electrode formed by patterning.

129. A material comprising a substrate and provided thereon, a transparent conductive layer, wherein the transparent conductive layer has a coefficient of variation of the ratio H/M in the thickness direction of not more than 5%, wherein H represents peak intensity of a hydrogen ion in the thickness direction of the transparent conductive layer measured according to dynamic SIMS, and M represents peak intensity of a metal ion derived from a main metal in the thickness direction of the transparent conductive layer measured according to dynamic SIMS.

130. The material of item 129 above, wherein the transparent conductive layer is formed on a substrate by introducing a reactive gas to a discharge space, exciting the reactive gas in a plasma state by discharge at atmospheric pressure or at approximately atmospheric pressure, and exposing the substrate to the reactive gas in a plasma state.

131. The material of item 130 above, wherein the reactive gas comprises a reducing gas.

132. The material of item 130 or 131, wherein an output density of not less than 1 W/cm² is applied at a frequency exceeding 100 kHz across the discharge space.

The present invention will be explained in detail below.

In the invention, a transparent conductive layer referred to is a transparent layer well known as industrial material, which does not absorb visible light (with a wavelength of from 400 to 700 nm), and is conductive. Since the transparent conductive layer is transparent, has in the visible wavelength region high transmissivity of free carrier, which transports electricity, is transparent, and has a high electric conductivity, it is used as a transparent electrode or an antistatic film.

The transparent conductive layer herein referred to may be a layer formed on a substrate to such an extent that it can function depending on its usage, but is not necessarily a continuous layer with which parts or the whole of the substrate surface are covered. Examples of the transparent conductive layer include a layer of metal such as Pt, Au, Ag or Cu, a layer of an oxide or a complex oxide doped with a dopant such as $SnO_2$, $In_2O_3$, CdO, ZnO, $SnO_2$:Sb, $SnO_2$:F, ZnO:Al, or $In_2O_3$:Sn, and a layer of a nonoxide such as chalcogenide, LaBe, TiN, or TiC. Of these, a layer of a tin doped indium oxide (hereinafter referred to also as ITO) has been widely used in its excellent electric properties or its ease of processability such as etching.

Next, the atmospheric pressure plasma CVD method, which is the transparent conductive layer forming method of the invention, will be explained.

The present invention is a transparent conductive layer forming method comprising the steps of introducing a reactive gas to a discharge space, exciting the reactive gas in a plasma state by discharge at atmospheric pressure or at approximately atmospheric pressure, and exposing a substrate to the reactive gas in a plasma state to form a transparent conductive layer on the substrate, wherein the reactive gas comprises a reducing gas.

In the atmospheric pressure plasma CVD in the invention, power (output density) of not more than 100 W/cm² is supplied at a high frequency voltage exceeding 0.5 kHz across a gap between opposed electrodes to excite a reactive gas in the gap and generate plasma.

In the invention, the upper limit of the frequency of the high frequency voltage applied across the gap between opposed electrodes is preferably 150 MHz, and more preferably not more than 15 MHz. The lower limit of the frequency of the high frequency voltage is preferably 0.5 kHz, more preferably 10 kHz, and still more preferably 100 kHz.

The lower limit of the power supplied across the gap between opposed electrodes is preferably 0.1 W/cm², and more preferably 1 W/cm². The upper limit of the power supplied across the gap between opposed electrodes is preferably 100 W/cm², and more preferably 60 W/cm². The discharge surface area (cm²) refers to the surface area of the electrode at which discharge occurs.

The high frequency voltage applied to the electrodes may be a continuous sine wave or a discontinuous pulsed wave. The continuous sine wave is preferred in securing the effects of the invention.

It is necessary in the invention that a plasma discharge apparatus be installed with electrodes which are capable of maintaining uniform glow discharge even when such a voltage is applied.

Such electrodes are preferably those in which a dielectric is coated on the surface of a metal base material. A dielectric is coated on at least one of a voltage application electrode and a ground electrode opposed to each other, and preferably on both electrodes. The dielectric used in the dielectric coated electrode of the invention is preferably an inorganic compound having a dielectric constant of from 6 to 45. Examples thereof include ceramic such as alumina or silicon nitride, and a glass lining material such as silicate glass or borate glass.

When a substrate placed or transported between the electrodes is exposed to plasma, one of the electrodes is preferably a roll electrode, the substrate being transported while directly contacting the roll electrode. The dielectric layer of the dielectric coated electrode, when the layer has been surface finished by polishing treatment so as to obtain a surface roughness Rmax (according to JIS B 0601) of not more than 10 μm, can maintain the dielectric layer thickness or a gap between the electrodes constant, provide stable discharge, and further, coverage of non-porous inorganic dielectric layer with high precision and without strain or cracks due to thermal shrinkage difference or residual stress can provide an electrode with greatly increased durability.

In preparing a dielectric coated electrode by coating a dielectric layer on a metal base material at high temperature, it is necessary that at least the dielectric layer surface of the dielectric coated electrode on the side contacting a substrate be surface finished by polishing treatment and the difference in thermal expansion between the dielectric layer and the metal base material be reduced, and a metal base material is preferably lined with an inorganic material layer, in which a foam content is controlled, as a stress absorbing layer. The inorganic material for lining is preferably glass produced according to a melting method, which is known as enamel etc. It is preferred that the foam content of the lowest layer which contacts the conductive metal base material is 20 to 30% by volume, and the foam content of the layer or layers provided on the lowest layer is not more than 5% by volume, which provides a good electrode with high density and without cracks.

Another preferred method for coating a dielectric on a metal base material is a method in which a ceramic is thermally splayed on the metal base material to form a ceramic layer with a void content of not more than 10% by volume, and sealed with an inorganic material capable of being hardened by a sol-gel reaction. In order to accelerate the sol gel reaction, heat hardening or UV irradiation is preferably carried out. Sealing treatment, in which coating of diluted sealing solution and hardening are alternately repeated several times, provides an electrode with improved inorganic property, with high density and without any deterioration.

A plasma discharge apparatus employing such an electrode will be explained below employing FIGS. 1 through 6.

A plasma discharge apparatus is one which induces discharge in the gap between a roll electrode, which is a ground electrode, and plural fixed electrodes, which are voltage application electrodes and face the roll electrode, introduces a reactive gas to the gap to excite the reactive gas in a plasma state, and exposes a long length substrate provided on the roll electrode to the reactive gas excited in a plasma state to form a layer on the substrate. A plasma discharge apparatus carrying out the layer forming method of the invention is not limited to that described above, but may be any one as long as a stable glow discharge is maintained and a reactive gas used for forming the layer is excited into a plasma state. As another method, there is a jetting method in which a substrate is provided or transported to the vicinity of electrodes but not between the electrodes, and then generated plasma is jetted to the substrate to form a layer on the substrate.

FIG. 1 shows a schematic drawing of one embodiment of the plasma discharge vessel equipped in a plasma discharge apparatus used in the layer forming method of the invention.

In FIG. 1, substrate F with long length is transported while wound around roll electrode 25 rotating in the transport direction (clockwise in FIG. 1). Electrodes 26, which are fixed, are composed of plural cylinders and opposed to the roll electrode 25. The substrate F, which has been wound around the roll electrode 25, is pressed with nip rollers 65 and 66, transported into a discharge space in the plasma discharge vessel 31 through guide roller 64, subjected to discharge plasma treatment, and then transported into the next process through guide roller 67. Blade 54 is provided at the vicinity of the nip rollers 65 and 66, and prevents air accompanied by the transported substrate F from entering the plasma discharge vessel 31.

The volume of the accompanied air is preferably not more than 1% by volume and more preferably not more than 0.1% by volume, based on the total volume of air in the plasma discharge vessel 31, which can be attained by the nip rollers 65 and 66 above.

A mixed gas used in the discharge plasma treatment (containing both inert gas and a reactive gas, a reducing gas and/or an organometallic compound) is introduced into the plasma discharge vessel 31 from supply port 52, and exhausted from exhaust port 53 after discharge treatment.

Figure 2:
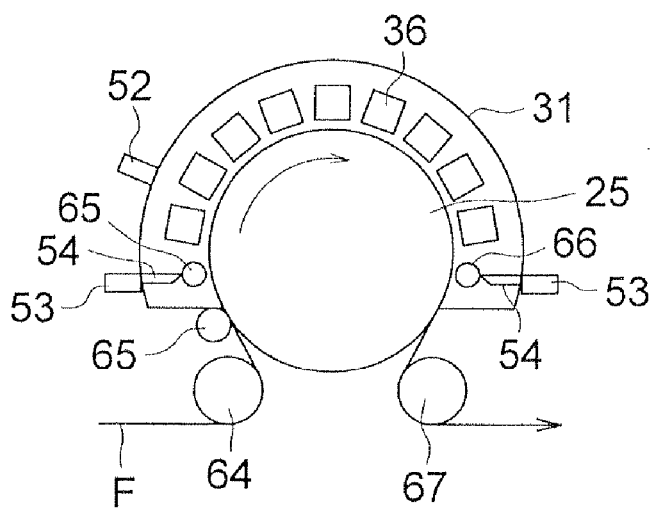
FIG. 2 shows a schematic drawing of another embodiment of the plasma discharge vessel equipped in a plasma discharge apparatus used in the manufacturing method of the invention.
Figure 3:
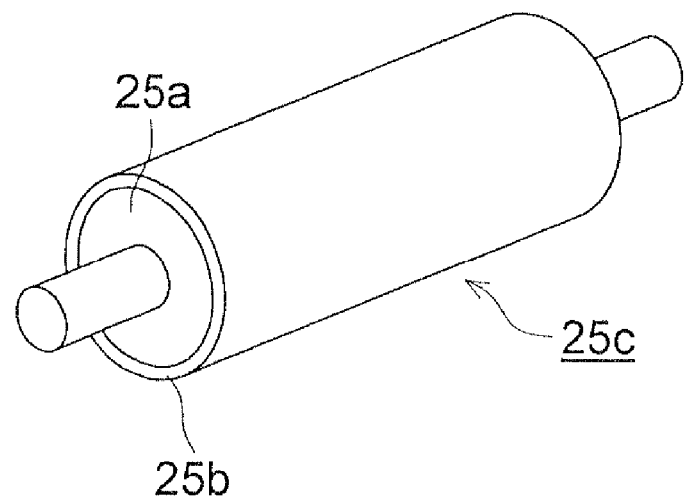
FIGS. 3(a) and 3(b) show a schematic drawing of embodiment of a cylindrical roll electrode used for plasma discharge in the invention.
Figure 3:
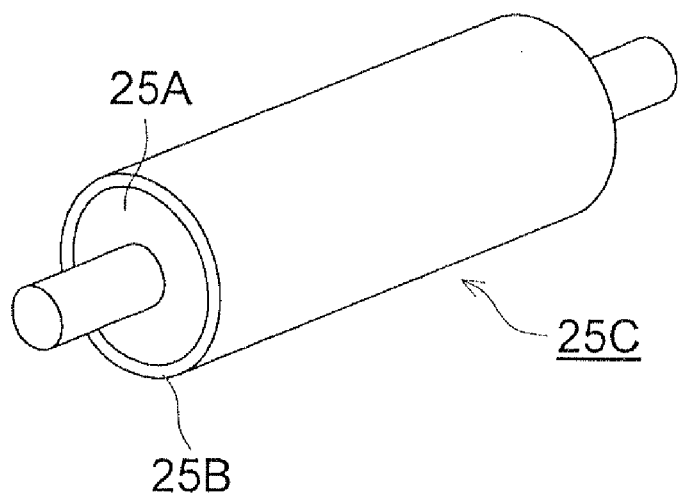
Figure 4:
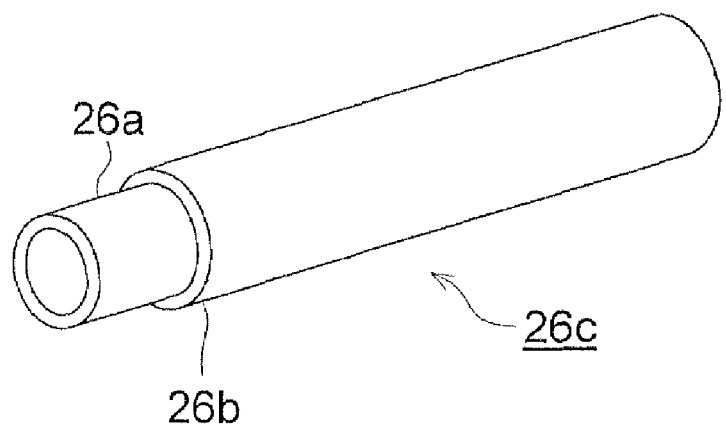
FIGS. 4(a) and 4(b) show a schematic drawing of embodiment of a fixed, cylindrical electrode used for plasma discharge in the invention.
Figure 4:
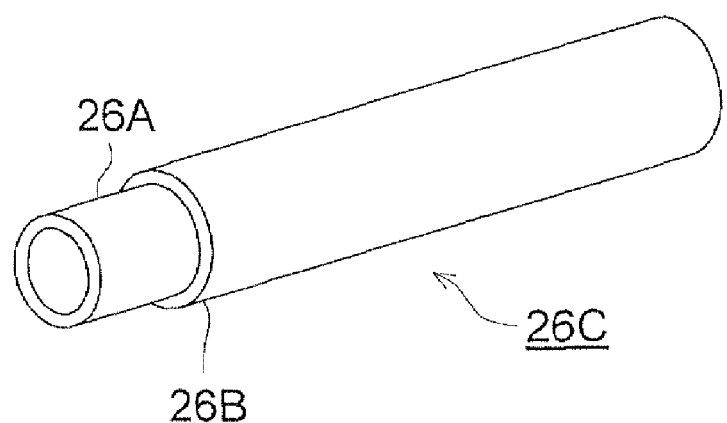

As in FIG. 1, FIG. 2 shows a schematic drawing of another embodiment of the plasma discharge vessel equipped in a plasma discharge apparatus used in the layer forming method of the invention. However, electrodes 26 in FIG. 1, which are fixed and opposed to the roll electrode 25, are cylindrical, while electrodes 36 in FIG. 2 are prismatic.

As compared with cylindrical electrodes 26 shown in FIG. 1, prismatic electrodes 36, as shown in FIG. 2, broaden the discharge region (discharge surface area), and are preferably used in the layer forming method of the invention.

Figure 5A:
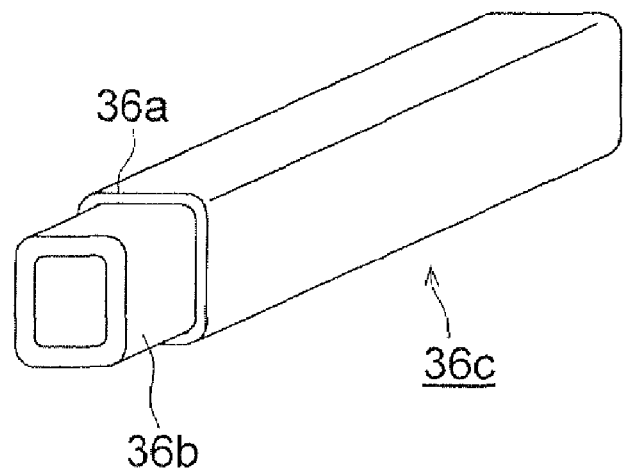
FIGS. 5(a) and 5(b) show a schematic drawing of embodiment of a fixed, prismatic electrode used for plasma discharge in the invention.
Figure 5B:
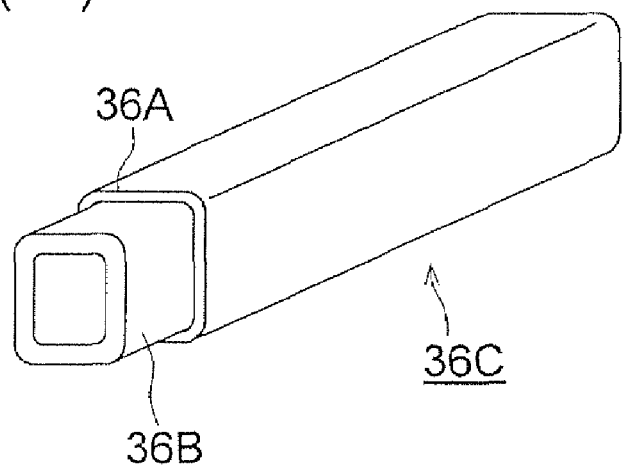

FIG. 3(a) and FIG. 3(b) each show a schematic drawing of embodiment of the cylindrical roll electrode described above, FIG. 4(a) and FIG. 4(b) each show a schematic drawing of embodiment of a cylindrical, fixed electrode, and FIG. 5(a) and FIG. 5(b) each show a schematic drawing of embodiment of a prismatic, fixed electrode.

In FIG. 3(a), roll electrode 25c, which is a ground electrode, is an electrode in which a conductive base roll 25a such as a metal roll is coated with ceramic to form a ceramic dielectric layer 25b as a dielectric layer, the coating being carried out by thermally spraying ceramic on the base roll to form a ceramic layer, and sealing the ceramic layer with sealing materials such as inorganic compounds. The roll electrode is prepared to have a ceramic dielectric layer with a thickness of 1 mm and a roll diameter of 200 φ, and is grounded. In FIG. 3(b), the roll electrode 25C may be an electrode in which a conductive base roll 25A such as a metal roll is lining coated with inorganic materials to form a lined dielectric layer 25B as a dielectric layer. Examples of the materials for lining include silicate glass, borate glass, phosphate glass, germanate glass, tellurite glass, aluminate glass, and vanadate glass. Among these, borate glass is preferably used in view of easy processability. Examples of a metal used in the conductive base roll 25a or 25A include metals such as silver, platinum, stainless steel, aluminum, and iron. Stainless steel is preferable in view of processability. The ceramic material used for thermal spraying is preferably alumina, silicon nitride, and more preferably alumina in view of easy processability. In one embodiment carried out in the invention, a base roll for the roll electrode employs a stainless steel jacket roll having therein a cooling means (not illustrated in the FIGS.) employing chilled water.

FIG. 4(a), FIG. 4(b), FIG. 5(a) and FIG. 5(b) show fixed electrodes 26c, 26C, 36c, and 36C, respectively, which are voltage application electrodes, and the electrodes have the same constitution as that of the roll electrode 25c or 25C, described above. That is, the same dielectric layer as above is coated on a hollow stainless steel pipe, and the resulting electrode is constructed so as to be cooled with chilled water during discharge. The fixed roll electrodes having a ceramic dielectric layer are prepared to give a roll diameter of 12 φ or 15 φ. Fourteen of the fixed electrodes are arranged around the circumference of the roll electrode described above.

Power sources for applying voltage to the voltage application electrode are not specifically limited. As the power sources, a high frequency power source (200 kHz) produced by Pearl Kogyo Co., Ltd., a high frequency power source (800 kHz) produced by Pearl Kogyo Co., Ltd., a high frequency power source (13.56 MHz) produced by Nippon Denshi Co., Ltd., and a high frequency power source (150 MHz) produced by Pearl Kogyo Co., Ltd. can be used.

Figure 6:
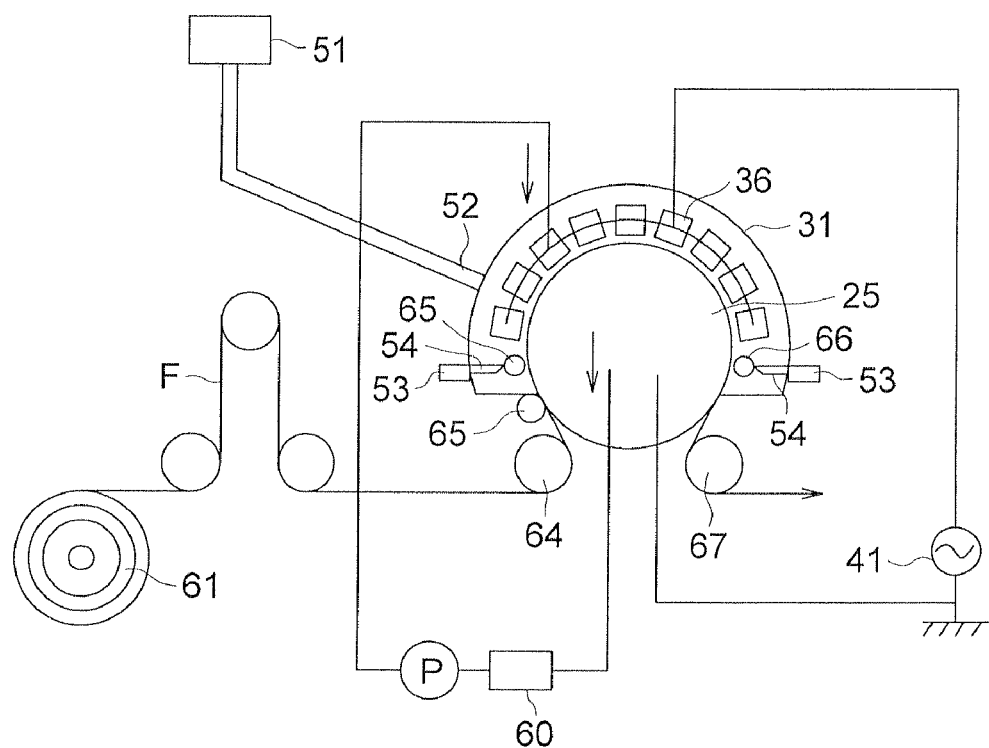
FIG. 6 shows a schematic drawing of one embodiment of a plasma discharge treatment apparatus used in the layer forming method of the invention.

FIG. 6 shows a schematic view of one embodiment of the plasma discharge apparatus used in the invention. In FIG. 6, plasma discharge vessel 31 has the same construction as that of FIG. 2, and in addition, a gas generating device 51, a power source 41, and an electrode cooling device 60 and so on are further provided. As a cooling agent used in the electrode cooling device 60, insulating materials such as distilled water and oil are used. Electrodes 25 and 36 shown in FIG. 6 are the same as those illustrated in FIGS. 3, 4, and 5. The gap distance between the opposed electrodes is, for example, approximately 1 mm.

The gap distance described above is determined considering thickness of a dielectric layer provided on the electrode base roll, applied voltage level, or an object of employing plasma. When one of the opposed electrodes described above has a dielectric layer or both opposed electrodes described above have a dielectric layer, the minimum gap distance between the electrode and the dielectric layer or between the both dielectric layers is preferably 0.5 to 20 mm, and more preferably 1±0.5 mm, in carrying out uniform discharge.

A mixed gas generated in the gas generating device 51 is introduced from supply port 52 in a controlled amount into a plasma discharge vessel 31, in which roll electrode 25 and fixed electrode 36 are arranged at a predetermined position, whereby the plasma discharge vessel 31 is charged with the mixed gas, and thereafter, the gas is exhausted from the exhaust port 53. Subsequently, the roll electrode 25 being grounded, voltage is applied to electrodes 36 by power source 41 to generate discharge plasma. From stock roll 61 in which substrate F is wounded, substrate F is transported to a gap between the electrodes in the plasma discharge vessel 31 through guide roller 64 (so that the one side of the substrate contacts the surface of the roll electrode 25), subjected to discharge plasma treatment while transporting in the device, and then transported to the next processing through guide roller 67. In the above, only the surface of the substrate opposite the surface contacting the roll electrode is subjected to discharge treatment.

The level of voltage applied to the fixed electrode 36 by power source 41 is optionally determined. For example, the voltage is 0.5 to 10 kV, and frequency of power source is adjusted to the range of from 0.5 kHz to 150 MHz. Herein, as a power supply method, either a continuous oscillation mode (called a continuous mode) with a continuous sine wave or a discontinuous oscillation mode (called a pulse mode) carrying ON/OFF discontinuously may be used, but the continuous mode is preferred in obtaining a uniform layer with high quality.

The vessel used in the plasma discharge vessel 31 is preferably a vessel of pyrex (R) glass, but a vessel of metal may be used if insulation from the electrodes is secured. For example, the vessel may be a vessel of aluminum or stainless steel laminated with a polyimide resin or a vessel of the metal which is thermally sprayed with ceramic to form an insulation layer on the surface.

In order to minimize an influence on the substrate during the discharge plasma treatment, the substrate temperature during the plasma discharge treatment is adjusted to a temperature of preferably from ordinary temperature (15 to 25° C.) to 300° C., and more preferably from ordinary temperature to 200° C., and still more preferably from ordinary temperature to 100° C. In order to adjust to the temperature within the range described above, the substrate or the electrodes are optionally cooled with a cooling means during the discharge plasma treatment.

In the invention, the discharge plasma treatment is carried out at atmospheric pressure or at approximately atmospheric pressure. Herein, approximately atmospheric pressure herein referred to implies a pressure of 20 kPa to 110 kPa. In order to obtain the effects as described in the invention, the pressure is preferably 93 kPa to 104 kPa.

In the electrodes for electric discharge used in the layer forming method of the invention, the maximum surface roughness Rmax of the surface of the electrode on the side contacting the substrate is adjusted to preferably not more than 10 µm in obtaining the effects as described in the invention, and adjusted to more preferably not more than 8 µm, and still more preferably not more than 7 µm. Herein, the maximum surface roughness is one defined in JIS B 0161.

Further, the center-line average surface roughness (Ra) as defined in JIS B 0161 is preferably not more than 0.5 µm, and more preferably not more than 0.1 µm.

Figure 7:
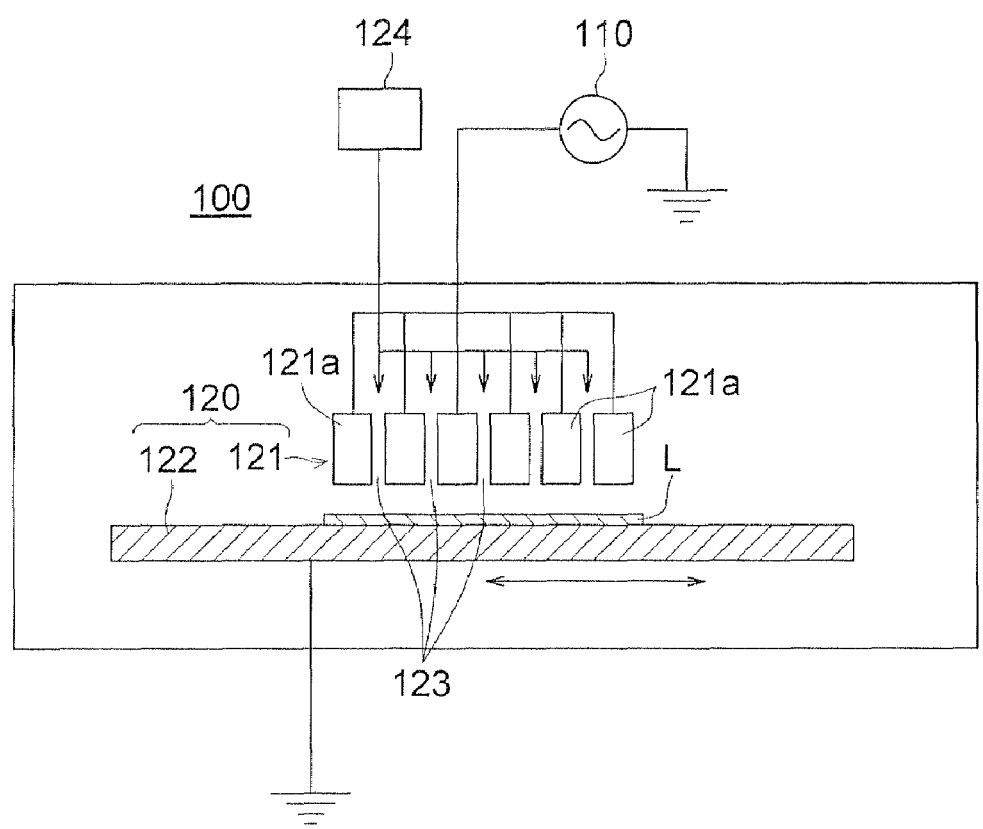
FIG. 7 shows a schematic drawing of one embodiment of a planar plasma discharge treatment apparatus with planar electrodes used in the layer forming method of the invention.

FIG. 7 shows a schematic drawing of one embodiment of a planar plasma discharge treatment apparatus with planar electrodes used in the layer forming method of the invention.

The plasma discharge treatment apparatus shown in FIG. 6 is applied to a substrate F, which can be bent as a flexible film. When the substrate is a substrate L with some thickness or a hard substrate L such that it is difficult to wind around the roll electrode, for example, a glass plate or lens, a planar plasma discharge treatment apparatus 100 installed with planar electrodes, shown in FIG. 7, is applied.

The plasma discharge treatment apparatus 100 comprises a power source 110 and an electrode 120 comprised of an upper planar electrode group 121 and a lower planar electrode 122 opposed to each other.

The upper planar electrode group 121 is comprised of plural rectangular electrodes 121a arranged to laterally form a line, and intervals between any adjacent two of the electrodes constitute gas paths. Gas supply inlets 123 are arranged so as to face a substrate L. A gas generation device 124 is provided over the upper planar electrode group 121. A reactive gas and inert gas are supplied to the gas supply inlets 123 from the gas generation device 124, and jetted to a space between the upper electrode group 121 and the lower electrode 122.

The substrate L is placed on the lower planar electrode 122, which is grounded, to face the gas supply inlets 123, and the lower planar electrode 122 is laterally reciprocated as shown by an arrow in FIG. 7. The lower electrode 122 moves as described above, and the substrate L is exposed to a gas in plasma state in a space between the upper planar electrode group 121 and the lower planar electrode 122 to form a layer on the surface of the substrate L. Since the substrate L also moves laterally, a layer is formed on a substrate L having an area larger than the discharge area of the electrode, and a uniform layer without unevenness is formed.

A mixed gas used in the transparent conductive layer forming method of the invention will be explained below.

A gas, used when the transparent conductive layer forming method of the invention is carried out, is basically a mixed gas of inert gas as a carrier gas for inducing discharge and a reactive gas for forming the transparent conductive layer, although it varies due to kinds of a transparent conductive layer formed on the substrate.

The reactive gas in the invention comprises a reducing gas. The reducing gas is preferably an inorganic gas with chemical reducibility containing no oxygen in the molecule. Examples of the reducing gas include hydrogen and hydrogen sulfide. The reducing gas is preferably hydrogen. In a mixed gas of the reducing gas and inert gas, the reducing gas content is preferably 0.0001 to 5.0% by volume, and more preferably 0.001 to 3.0% by volume.

The reducing gas is considered to act on the reactive gas forming a transparent conductive layer and to have an effect of forming a transparent conductive layer with good electric properties.

It is preferred in the invention that a mixed gas, introduced into a discharge space in which plasma is generated, does not substantially contain an oxygen gas. The sentence "a mixed gas does not substantially contain an oxygen gas" implies that a mixed gas does not contain an oxygen gas in such an extent canceling the above-described effects of forming a transparent conductive layer with good electric properties. In the transparent conductive layer forming method of the invention, an oxygen gas has a tendency to deteriorate electric properties of the transparent conductive layer, but an oxygen gas in a small amount may be present as long as it does not deteriorate the electric properties. In order to form an atmosphere that does not substantially contain an oxygen gas in the invention, inert gas with high purity is suitably used as inert gas used.

The reactive gas content of the mixed gas is preferably 0.01 to 10% by volume. The transparent conductive layer to be formed has a thickness of 1 nm to 1000 nm.

The inert gas herein referred to implies an element belonging to group XVIII in the periodic table, and is typically helium, neon, argon, krypton, xenon, or radon. In order to obtain the effects of the invention, helium or argon is preferably used.

The reactive gas, which is a gas excited to plasma state at discharge space, contains a component for forming a transparent conductive layer, for example, an organometallic compound such as a β-diketone metal complex, a metal oxide or a metal alkyl. As kinds of the reactive gas, there are a reactive gas providing a main component of the transparent conductive layer, a reactive gas used in a small amount for the purpose of doping, and a reactive gas used in order to adjust electric resistance of the transparent conductive layer.

The transparent conductive layer formed according to the transparent conductive layer forming method of the invention has a feature in that it has high carrier mobility. As is well known, electric conductivity of a transparent conductive layer is represented by the following formula (1):

$$\sigma = ne\mu \quad \text{formula (1)}$$

wherein σ represents electric conductivity, n represents carrier density, e represents quantity of electricity of electrons, and µ represents carrier mobility.

It is necessary to increase carrier density or carrier mobility in order to increase electric conductivity. However, when carrier density increases, reflectance increases at a carrier density of not less than approximately $2 \times 10^{21}$ cm$^{-3}$, and degree of transparency decreases. Accordingly, it is necessary to increase carrier mobility in order to increase electric conductivity. The carrier mobility of a transparent conductive layer formed according to the DC magnetron sputtering method available on the market is approximately 30 cm²/V·sec. It has been found that when the transparent conductive layer forming method of the invention is used under optimum conditions, it is possible to form a transparent conductive layer having carrier mobility higher than that formed according to the DC magnetron sputtering.

Since the transparent conductive layer forming method of the invention provides high carrier mobility, it can provide a transparent conductive layer with a low resistance having a specific resistance of not more than $1 \times 10^{-3}$ Ω·cm without doping. The resistance of the transparent conductive layer can be further reduced by carrying out doping and increasing a carrier density. A transparent conductive layer with a high resistance having a specific resistance of not less than $1 \times 10^{-2}$ Ω·cm can be also formed by optionally employing a reactive gas increasing resistance.

The transparent conductive layer formed according to the transparent conductive layer forming method of the invention has a carrier mobility of not less than 10 cm²/V·sec.

The transparent conductive layer formed according to the transparent conductive layer forming method of the invention has a carrier density of not less than $1 \times 10^{19}$ cm⁻³, and preferably of not less than $1 \times 10^{20}$ cm⁻³.

The transparent conductive layer of the invention may contain carbon in a small amount, since an organometallic compound is optionally used as a reactive gas. In this case, the carbon content of the transparent conductive layer is preferably from more than 0 to 5.0 atomic %, and more preferably from 0.01 to 3.0 atomic %.

The transparent conductive layer of the invention has a coefficient of variation in the thickness direction of the ratio H/M of preferably not more than 5%, in which H represents peak intensity of a hydrogen ion in the thickness direction and M represents peak intensity of a metal ion derived from the main metal oxide in the thickness direction, each being measured according to dynamic SIMS. As a method of preparing such a transparent conductive layer, there is mentioned of the atmospheric pressure plasma discharge treatment as described above, in which a hydrogen gas is used as the reducing gas.

When the transparent conductive layer of the invention is analyzed according to dynamic SIMS to obtain peak intensity in the thickness direction of a hydrogen ion and peak intensity in the thickness direction of a metal ion derived from the main metal oxide, variation in the thickness direction of the ratio H/M is not more than a specific value (wherein H represents peak intensity in the thickness direction of a hydrogen ion and M represents peak intensity in the thickness direction of a metal ion derived from the main metal oxide). Degree of the variation is preferably represented by coefficient of variation in the thickness direction of the ratio H/M. The coefficient of variation in the thickness direction of the ratio H/M in the transparent conductive layer of the invention is preferably not more than 5%, more preferably not more than 3%, and still more preferably not more than 1%. Regarding dynamic secondary ion-mass spectrography (hereinafter referred to as dynamic SIMS including a spectrometer), JITSUYO HYOMEN BUNSEKI NIJIION SITSURYO BUNSEKI edited by HYOMEN KAGAKUKAI (2001, MARUZEN) is referred to.

In the invention, preferred dynamic SIMS measurement conditions are as follows.

| | |
|---|---|
| Spectrometer used: | ADEPT 1010 produced by Physical Electronics Co., Ltd. Or TYPE 6300 secondary ion mass spectrometer |
| Primary ion used: | Cs |
| Primary ion energy: | 5.0 KeV |
| Primary ion current: | 200 nA |
| Area radiated by primary ion: | 600 μm square |
| Absorption rate of secondary ion: | 25% |
| Secondary ion polarity: | Negative |
| Secondary ions to be detected: | H⁻ and M⁻ |
| (M represents a metallic element.) | |

Mass analysis is carried out under the above-described conditions while sputtering the metal-containing layer in the thickness direction. The ratio H/M of peak intensity of a hydrogen ion to peak intensity of a metal ion from the main metal oxide is determined from the resulting depth profile. The ratio H/M is determined preferably at not less than 50 points, and more preferably at not less than 75 points, per a 100 nm thickness of the transparent conductive layer. The ratios H/M at portions from 15 to 85% of the thickness are determined, and their average and standard deviation are obtained. The standard deviation is divided by the average and multiplied by 100 to obtain coefficient of variation of H/M in the thickness direction, which shows degree of variation of H/M.

In the invention, the ratio H/M is in the range of preferably from 0.001 to 50, and more preferably from 0.01 to 20. In the invention, the ratio H/M in the thickness direction is determined according to the above-mentioned, and the ratios H/M in the thickness direction at portions from 15 to 85% of the thickness are determined. The average of the resulting ratios H/M is defined as the ratio H/M in the invention.

The hydrogen concentration of the transparent conductive layer of the invention is preferably 0.001 to 10 atomic %, more preferably 0.01 to 5 atomic %, and still more preferably 0.5 to 1 atomic %. The hydrogen concentration is determined according to the dynamic SIMS under the conditions as described above. Firstly, based on the hydrogen concentration of a standard transparent conductive layer, which is determined according to a Rutherford back scattering spectrography, and intensity of the hydrogen ion of the standard transparent conductive layer obtained according to the dynamic SIMS, relative sensitivity coefficient is obtained. Next, based on the intensity of the hydrogen ion of a transparent conductive layer of a sample to be measured obtained according to the dynamic SIMS and the relative sensitivity coefficient obtained above, the hydrogen concentration of the sample is computed. In the invention, a hydrogen concentration of the transparent conductive layer is measured through the entire thickness thereof to obtain a depth profile of the hydrogen concentration. Hydrogen concentrations are obtained at portions from 15 to 85% of the thickness from the depth profile obtained above, and the average thereof is defined as the hydrogen concentration in the invention.

Methods of preparing a transparent conductive layer having a coefficient of variation in the thickness direction of the ratio H/M of not more than 5%, (wherein H represents peak intensity of a hydrogen ion and M represents peak intensity of a metal ion from the main metal oxide each being measured according to dynamic SIMS), are not specifically limited, and include the atmospheric pressure plasma discharge treatment as described above, that is, a method comprising the steps of introducing a reactive gas to a discharge space at atmospheric pressure or at approximately atmospheric pressure, exciting the reactive gas in a plasma state by discharge, and exposing a substrate to the reactive gas in a plasma state to form a transparent conductive layer on the substrate. It is preferred that the reactive gas be a reducing gas, which makes it easy to obtain not more than 5% of the above coefficient. It is more preferred that an output density of not less than 1 W/cm$^2$ be applied across the discharge space at a frequency exceeding 100 kHz, which similarly makes it easy to obtain not more than 5% of the above coefficient. The reason is not apparent, but the above reducing atmosphere or high power electric field as described above is considered to be conditions which can provide uniformity of the transparent conductive layer and reduce variation in the thickness direction of peak intensity of a hydrogen ion and peak intensity of a metal ion from the main metal oxide in the transparent conductive layer.

The reactive gas used for constituting a main component of the transparent conductive layer in the invention is preferably an organometallic compound having an oxygen atom in the molecule. The organometallic compound has, in the chemical structure, preferably a metal belonging to a group, Ib, IIb, IIIb, IVb, Vb, VIb, or VIII of the periodic table. Preferred examples of the organometallic compound include indium hexafluoropentanedionate, indium methyl(trimethyl)acetylacetonate, indium acetylacetonate, indium isopropoxide, indium trifluoropentanedionate, tris(2,2,6,6-tetramethyl-3,5-heptanedionato)indium, di-n-butylbis(2,4-pentanedionato) tin, di-n-butyldiacetoxytin, di-t-butyldiacetoxytin, tetraisopropoxytin, tetrabutoxytin, and zinc acetylacetonate. Of these, indium acetylacetonate, tris(2,2,6,6-tetramethyl-3,5-heptanedionato)indium, zinc acetylacetonate, and di-n-butyldiacetoxytin are preferred.

Examples of the reactive gas for doping include aluminum isopropoxide, nickel acetylacetonate, manganese acetylacetonate, boron isopropoxide, n-butoxyantimony, tri-n-butylantimony, di-n-butylbis(2,4-pentanedionato)tin, di-n-butyldiacetoxytin, di-t-butyldiacetoxytin, tetraisopropxytin, tetrabutopxytin, tetrabutyltin, zinc acetylacetonate, hexafluoropropylene, octafluorocyclobutane, and carbon tetrafluoride.

Examples of the reactive gas used for adjusting resistivity of the transparent conductive layer include titanium triisopropoxide, tetramethoxysilane, tetraethoxysilane, and hexamethyldisiloxane.

When a transparent conductive layer is formed, the amount of a first reactive gas providing the main component of the layer and a second reactive gas in a small amount for doping differs due to the kinds of the transparent conductive layer. For example, when an ITO layer comprised of indium oxide doped with tin is formed, the amount of reactive gases used is adjusted so that an atomic ratio In/Sn of the ITO layer falls within the range of from 100/0.1 to 100/15, and preferably from 100/0.5 to 100/10. The atomic ratio In/Sn is obtained by measurement according to XSP.

When a transparent conductive layer (hereinafter referred to as FTO layer) comprised of tin oxide doped with fluorine is formed, the amount of reactive gases used is adjusted so that an atomic ratio Sn/F of the ITO layer falls within the range of from 100/0.01 to 100/50. The atomic ratio Sn/F is obtained by measurement according to XSP.

When an $In_2O_3$—ZnO amorphous transparent conductive layer is formed, the amount of reactive gases used is adjusted so that an atomic ratio In/Zn of the ITO layer falls within the range of from 100/50 to 100/5. The atomic ratio In/Zn is obtained by measurement according to XSP.

The substrate used in the invention may be in the form of film, in the form of sheet or in the form of stereoscopic body, for example, in the form of lens, as long as it can form a transparent conductive layer on its surface. When the substrate is one capable of being provided between electrodes, a transparent conductive layer can be formed by placing the substrate in plasma generated between the electrodes, and when the substrate is one incapable of being provided between the electrodes, a transparent conductive layer can be formed by spraying the generated plasma onto the substrate.

Materials constituting the substrate are not specifically limited, but resins are preferred in that discharge is a low temperature glow discharge, and is carried out at atmospheric pressure or at approximately atmospheric pressure.

For example, a film of cellulose ester such as cellulose triacetate, polyester, polycarbonate or polystyrene, or one, in which a gelatin layer, a polyvinyl alcohol (PVA) layer, an acryl resin layer, a polyester resin layer or a cellulose resin layer is coated on the above described film, is used as the substrate. Further, a substrate obtained by coating an anti-glare layer, a clear hard coat layer, a backing layer or an anti-static layer on a support can be used as the substrate.

Examples of the support (which can be also used as the substrate) include a polyester film such as a polyethylene terephthalate or polyethylene naphthalate film, a polyethylene film, a polypropylene film, a cellophane film, a film of a cellulose ester such as cellulose diacetate, cellulose acetate butyrate, cellulose acetate propionate, cellulose acetate phthalate, cellulose triacetate, cellulose nitrate or their derivative, a polyvinylidene chloride film, a polyvinyl alcohol film, an ethylene-vinyl alcohol film, a syndiotactic polystyrene film, a polycarbonate film, a norbornene resin film, a polymethylpentene film, a polyetherketone film, a polyimide film, a polyethersulfone film, a polysulfone film, a polyetherketoneimide film, a polyamide film, a fluorine-containing resin film, a nylon film, a polymethyl methacrylate film, an acryl film, and a polyarylate film.

These materials can be used singly or as a mixture of two or more kinds thereof. Commercially available materials such as Zeonecks (produced by Nippon Zeon Co., Ltd.) or ARTON (produced by Nippon Gosei Gomu Co., Ltd.) can be preferably used. Materials such as polycarbonate, polyacrylate, polysulfone and polyethersulfone, which have a high specific birefringence, can be also used by properly controlling a solution casting condition, a melt extrusion condition, or a stretching condition in the transverse or mechanical direction. The substrate in the invention is not specifically limited to those described above. The substrate in the invention has a thickness of preferably 10 to 1000 μm.

In the invention, the transparent conductive layer is formed on a substrate such as a glass plate or a plastic film, but an adhesion layer may be optionally provided between the substrate and the transparent conductive layer in order to increase adhesion between them. Further, an anti-reflection layer may be provided on the surface of the substrate opposite the transparent conductive layer in order to improve optical properties. An anti-stain layer may be provided as an outermost layer. Another layer such as a gas barrier layer or a solvent resistant layer can be also provided.

A method of forming these layers is not specifically limited, and for example, a coating method, a vacuum deposition method, a sputtering method, or an atmospheric pressure plasma CVD method can be used. The atmospheric pressure plasma CVD method is preferred.

As the atmospheric pressure plasma CVD method, a method can be used which is disclosed as an anti-reflection layer forming method, for example, in Japanese Patent O.P.I. Publication No. 2000-021573.

In the invention, the transparent conductive layer is provided on a substrate so that a deviation of the layer thickness from the average thickness falls within preferably ±10%, more preferably ±5%, and still more preferably ±1%.

EXAMPLES

Example 1

A glass plate (50 mm×50 mm×1 mm) on which an approximately 50 nm thick silica film was formed as an alkali barrier coat was used as a substrate.

A planar plasma discharge treatment apparatus shown in FIG. 7 was used in which two kinds of flat electrodes were opposed in parallel with each other. The above-described glass plate was placed in a space between the opposed electrodes and a mixed gas was introduced to the space. A layer was formed on the glass plate according to the following.

The electrodes as described below were used.

A stainless steel plate having a size of 200 mm×200 mm×2 mm was coated with an alumina thermal spray layer with high density and high adhesion to obtain an electrode, and then a solution prepared by diluting tetramethoxysilane with ethyl acetate was coated on the resulting electrode, dried and hardened by UV ray irradiation to carry out sealing treatment. Thus, a dielectric layer coated electrode was obtained. The dielectric layer surface of the electrode was polished, smoothed, and processed to give an Rmax of 5 μm. The resulting electrode was grounded.

The same dielectric layer as above was coated on hollow, prismatic pure titanium pipes under the same condition as above. Thus, plural electrodes were prepared as a group of voltage application electrodes, and were provided opposed to the electrode obtained above.

As a power supply for generating plasma, a high frequency power supply JRF-10000 (13.56 MHz) produced by Nihon Denshi Co. Ltd. was used, and power of 5 W/cm$^2$ was supplied at a frequency of 13.56 MHz.

A gas having the composition as shown below was supplied to the gap between the opposed electrodes.

| Inert gas: helium | 98.5% by volume |
|---|---|
| Reactive gas 1: hydrogen | 0.25% by volume |
| Reactive gas 2: tris(2,4-pentanedionato)indium | 1.2% by volume |
| Reactive gas 3: dibutyltin diacetate | 0.05% by volume |

The glass plate prepared above was subjected to atmospheric pressure plasma treatment under the above conditions employing the above gas to form a tin doped indium oxide layer. The formed indium oxide layer was evaluated according to the following methods.

<Measurement of Transmittance>

Transmittance was measured according to JIS-R-1635, employing a spectrophotometer TYPE 1U-4000 (produced by Hitachi Seisakusho Co., Ltd.). The wavelength of light used was 550 nm.

<Measurement of Layer Thickness and Layer Forming Speed>

The thickness of the indium oxide layer was measured employing Spectral Reflectance Thickness Monitor FE-3000 produced by Photal Co. The layer forming speed was obtained by dividing the thickness by the plasma treatment time.

<Resistivity>

Resistivity was measured according to JIS-R-1637, employing a four terminal method. The measurement was carried out employing Loresta GP, MCP-T600 produced by Mitsubishi Chemical Corporation.

<Hall Effect>

Hall effect was measured according to a van der Pauw's method employing M1-675 system of Sanwa Musen Sokki Kenkyusho, and density of carrier and mobility of carrier were determined.

<Composition of Indium Oxide Layer>

The indium oxide layer on the glass plate was dissolved with hydrochloric acid, and the content of indium and tin in the layer was determined employing an inductive coupling plasma emission spectrometer SPS-4000 produced by Seiko electric Co.

<Measurement of Carbon Content>

The carbon content was measured employing an XPS surface analyzer. The XPS surface analyzer used is not specifically limited, and any kinds of surface analyzers can be used, but in the examples, ESCALAB-200R produced by VG Scientifics Co., Ltd. was employed. Measurement was made at an output of 600 W (an acceleration voltage of 15 kV, and emission current of 40 mA), employing Mg as an X ray anode. Energy dissolution regulated to a peak width at half height of clean Ag 3d5/2 was set to be 1.5 to 1.7 eV. In order to eliminate an influence due to contamination, it is necessary that before measurement, a surface layer corresponding to 10 to 20% of the formed layer thickness be removed by etching. The surface layer is preferably removed employing an ion gun capable of using a rare gas ion. Examples of the ion include an ion of He, Ne, Ar, Xe, or Kr. In this example, the surface layer was removed employing argon ion etching.

Measurement was made at a measurement interval of 1.0 eV in the bond energy range of 0 to 1100 eV, and firstly, an element to be detected was examined.

Next, measurement was made at a measurement interval of 0.2 eV on each of the detected elements except for the element for etching, and a narrow scanning of the photo-electron peak providing a maximum intensity was carried out. Thus, the spectrum of each element was obtained. In order to eliminate variation of the carbon content obtained due to kinds of analyzers or computers employed, the resulting spectrum was transferred to COMMON DATA PROCESSING SYSTEM (preferably Version 2.3 or Versions thereafter) produced by VAMAS-SCA-JAPAN Co., Ltd., and processed with its software to obtain a carbon content in terms of atomic concentration (at atomic %). The tin to indium ratio was also represented in terms of atomic concentration ratio.

Before quantitative processing, calibration of Count Scale on each element detected was carried out, and 5 point smoothing processing was carried out. In the quantitative processing, the peak area intensity (cps·eV) except for the background was employed. The background processing was carried out employing a Shirley method.

The Shirley method was described in D. A. Shirley, Phys. Rev., B5, 4709 (1972).

Example 2

The glass plate was subjected to atmospheric pressure plasma treatment to form a tin doped indium oxide layer in the same manner as in Example 1 above, except that the composition of the gas used was changed as shown below.

| | |
|---|---|
| Inert gas: helium | 98.65% by volume |
| Reactive gas 1: hydrogen | 0.10% by volume |
| Reactive gas 2: tris(2,4-pentanedionato)indium | 1.2% by volume |
| Reactive gas 3: dibutyltin diacetate | 0.05% by volume |

Example 3

The glass plate was subjected to atmospheric pressure plasma treatment to form a tin doped indium oxide layer in the same manner as in Example 1 above, except that the composition of the gas used was changed as shown below. The formed indium oxide layer was evaluated in the same manner as in Example 1.

| | |
|---|---|
| Inert gas: helium | 98.25% by volume |
| Reactive gas 1: hydrogen | 0.5% by volume |
| Reactive gas 2: tris(2,4-pentanedionato)indium | 1.2% by volume |
| Reactive gas 3: dibutyltin diacetate | 0.05% by volume |

Example 4

The glass plate was subjected to atmospheric pressure plasma treatment to form a tin doped indium oxide layer in the same manner as in Example 1 above, except that the composition of the gas used was changed as shown below. The formed indium oxide layer was evaluated in the same manner as in Example 1.

| | |
|---|---|
| Inert gas: helium | 98.75% by volume |
| Reactive gas 1: hydrogen | 1.00% by volume |
| Reactive gas 2: tris(2,4-pentanedionato)indium | 1.2% by volume |
| Reactive gas 3: dibutyltin diacetate | 0.05% by volume |

Example 5

The glass plate was subjected to atmospheric pressure plasma treatment to form a tin doped indium oxide layer in the same manner as in Example 1 above, except that the composition of the gas used was changed as shown below. The formed indium oxide layer was evaluated in the same manner as in Example 1.

| | |
|---|---|
| Inert gas: helium | 98.5% by volume |
| Reactive gas 1: hydrogen sulfide | 0.25% by volume |
| Reactive gas 2: tris(2,4-pentanedionato)indium | 1.2% by volume |
| Reactive gas 3: dibutyltin diacetate | 0.05% by volume |

Example 6

The glass plate was subjected to atmospheric pressure plasma treatment to form a tin doped indium oxide layer in the same manner as in Example 1 above, except that the composition of the gas used was changed as shown below. The formed indium oxide layer was evaluated in the same manner as in Example 1.

| | |
|---|---|
| Inert gas: argon | 98.5% by volume |
| Reactive gas 1: hydrogen | 0.25% by volume |
| Reactive gas 2: tris(2,4-pentanedionato)indium | 1.2% by volume |
| Reactive gas 3: dibutyltin diacetate | 0.05% by volume |

Example 7

The glass plate was subjected to atmospheric pressure plasma treatment to form a tin doped indium oxide layer in the same manner as in Example 1 above, except that the composition of the gas used was changed as shown below. The formed indium oxide layer was evaluated in the same manner as in Example 1.

| | |
|---|---|
| Inert gas: argon | 98.65% by volume |
| Reactive gas 1: hydrogen | 0.10% by volume |
| Reactive gas 2: tris(2,4-pentanedionato)indium | 1.2% by volume |
| Reactive gas 3: dibutyltin diacetate | 0.05% by volume |

Example 8

The glass plate was subjected to atmospheric pressure plasma treatment to form a tin doped indium oxide layer in the same manner as in Example 1 above, except that the composition of the gas used was used changed as shown below. The formed indium oxide layer was evaluated in the same manner as in Example 1.

| | |
|---|---|
| Inert gas: helium and argon (helium to argon ratio by Volume of 70/30) | 98.5% by volume |
| Reactive gas 1: hydrogen | 0.25% by volume |
| Reactive gas 2: tris(2,4-pentanedionato)indium | 1.2% by volume |
| Reactive gas 3: dibutyltin diacetate | 0.05% by volume |

Example 9

The glass plate was subjected to atmospheric pressure plasma treatment to form a tin doped indium oxide layer in the same manner as in Example 1 above, except that the composition of the gas used was changed as shown below. The formed indium oxide layer was evaluated in the same manner as in Example 1.

| | |
|---|---|
| Inert gas: mixed gas of helium and argon (helium to argon ratio by volume of 70/30) | 98.65% by volume |
| Reactive gas 1: hydrogen | 0.10% by volume |
| Reactive gas 2: tris(2,4-pentanedionato)indium | 1.2% by volume |
| Reactive gas 3: dibutyltin diacetate | 0.05% by volume |

Example 10

The glass plate was subjected to atmospheric pressure plasma treatment to form a tin doped indium oxide layer in the same manner as in Example 1 above, except that the composition of the gas used was changed as shown below. The formed indium oxide layer was evaluated in the same manner as in Example 1.

| | |
|---|---|
| Inert gas: nitrogen | 98.5% by volume |
| Reactive gas 1: hydrogen | 0.25% by volume |
| Reactive gas 2: tris(2,4-pentanedionato)indium | 1.2% by volume |
| Reactive gas 3: dibutyltin diacetate | 0.05% by volume |

Comparative Example 1

The glass plate prepared in example 1 was placed in a vacuum chamber of a DC magnetron sputtering apparatus, and the pressure in the chamber was reduced to less than $1 \times 10^{-3}$ Pa. As the sputtering target, a composition comprised of indium oxide and tin oxide (indium oxide: tin oxide=95:5) was used. After that, a mixed gas of argon and oxygen (Ar:$O_2$ =100:3) was introduced in the vacuum chamber till pressure reached $1 \times 10^{-3}$ Pa, and a sputtering output of 100 W was applied at 100° C. of the plate to form a layer on the plate. The formed indium oxide layer was evaluated in the same manner as in Example 1.

Comparative Example 2

The glass plate was subjected to atmospheric pressure plasma treatment to form a tin doped indium oxide layer in the same manner as in Example 1 above, except that the composition of the gas used was changed as shown below. The formed indium oxide layer was evaluated in the same manner as in Example 1.

| | |
|---|---|
| Inert gas: helium | 98.5% by volume |
| Reactive gas 1: oxygen | 0.25% by volume |
| Reactive gas 2: tris(2,4-pentanedionato)indium | 1.2% by volume |
| Reactive gas 3: dibutyltin diacetate | 0.05% by volume |

Comparative Example 3

The glass plate was subjected to atmospheric pressure plasma treatment to form a tin doped indium oxide layer in the same manner as in Example 1 above, except that the composition of the gas used was changed as shown below. The formed indium oxide layer was evaluated in the same manner as in Example 1.

| | |
|---|---|
| Inert gas: helium | 98.70% by volume |
| Reactive gas 1: oxygen | 0.05% by volume |
| Reactive gas 2: tris(2,4-pentanedionato)indium | 1.2% by volume |
| Reactive gas 3: dibutyltin diacetate | 0.05% by volume |

Comparative Example 4

The glass plate was subjected to atmospheric pressure plasma treatment to form a tin doped indium oxide layer in the same manner as in Example 1 above, except that the composition of the gas used was changed as shown below. The formed indium oxide layer was evaluated in the same manner as in Example 1.

| | |
|---|---|
| Inert gas: helium | 98.5% by volume |
| Reactive gas 1: oxygen | 0.25% by volume |
| Reactive gas 2: tris(2,4-pentanedionato)indium | 1.2% by volume |
| Reactive gas 3: dibutyltin diacetate | 0.05% by volume |

Comparative Example 5

The glass plate was subjected to atmospheric pressure plasma treatment to form a tin doped indium oxide layer in the same manner as in Example 1 above, except that the composition of the gas used was changed as shown below. The formed indium oxide layer was evaluated in the same manner as in Example 1.

| | |
|---|---|
| Inert gas: a mixed gas of helium and argon (helium to argon ratio by volume 70/30) | 98.5% by volume |
| Reactive gas 1: oxygen | 0.25% by volume |
| Reactive gas 2: tris(2,4-pentanedionato)indium | 1.2% by volume |
| Reactive gas 3: dibutyltin diacetate | 0.05% by volume |

Comparative Example 6

Monoethanolamine of 0.4 g, 3.8 g of indium acetate and 0.16 g of $Sn(OC_4H_9)_4$ was added to 22.2 g of 2-methoxymethanol, and stirred for 10 minutes. The resulting solution was dip coated on the glass plate prepared in Example 1 at a speed of 1.2 cm/minute, and dried in an electric furnace at 500° C. for one hour.

The evaluation results of Examples 1 through 10 and comparative examples 1 through 6 are collectively shown in Table 1.

TABLE 1

| | Inert gas | Reactive gas 1 | Concentration of reactive gas 1 (volume %) | Layer forming speed (nm/min) | Transmittance (%) | Resistivity ($10^{-4}$ Ω·cm) | Density of carrier ($10^{19}$ cm$^{-3}$) | Mobility of carrier (cm$^2$/Vsec) | SN/In ratio | Carbon content (atomic %) |
|---|---|---|---|---|---|---|---|---|---|---|
| Ex. 1 | He | H2 | 0.25 | 12 | 91 | 3.4 | 20 | 90 | 7.2 | 0.4 |
| Ex. 2 | He | H2 | 0.10 | 11 | 89 | 3.8 | 19 | 85 | 7.5 | 0.5 |
| Ex. 3 | He | H2 | 0.50 | 11 | 91 | 3.9 | 27 | 60 | 7.4 | 0.4 |
| Ex. 4 | He | H2 | 1.00 | 10 | 89 | 4.2 | 46 | 32 | 7.3 | 0.6 |

TABLE 1-continued

| | Inert gas | Reactive gas 1 | Concentration of reactive gas 1 (volume %) | Layer forming speed (nm/min) | Transmittance (%) | Resistivity ($10^{-4}\,\Omega\cdot cm$) | Density of carrier ($10^{19}\,cm^{-3}$) | Mobility of carrier ($cm^2/Vsec$) | SN/In ratio | Carbon content (atomic %) |
|---|---|---|---|---|---|---|---|---|---|---|
| Ex. 5 | He | H2S | 0.25 | 9 | 86 | 4.8 | 52 | 25 | 7.4 | 0.6 |
| Ex. 6 | Ar | H2 | 0.25 | 10 | 87 | 3.9 | 21 | 76 | 7.1 | 0.6 |
| Ex. 7 | Ar | H2 | 0.10 | 14 | 86 | 3.8 | 21 | 78 | 7.6 | 0.5 |
| Ex. 8 | Ar/He | H2 | 0.25 | 12 | 91 | 3.7 | 20 | 83 | 7.9 | 0.4 |
| Ex. 9 | Ar/He | H2 | 0.10 | 14 | 88 | 3.8 | 24 | 68 | 7.3 | 0.7 |
| Ex. 10 | N2 | H2 | 0.25 | 9 | 86 | 4.7 | 44 | 30 | 7.2 | 0.5 |
| Comp. Ex. 1 | — | — | — | 0.3 | 86 | 4.0 | 55 | 30 | 7.1 | 0.2 |
| Comp. Ex. 2 | He | O2 | 0.25 | 8 | 84 | 34 | 9.3 | 20 | 7.6 | 0.5 |
| Comp. Ex. 3 | He | O2 | 0.05 | 7 | 86 | 73 | 8.5 | 10 | 7.2 | 0.6 |
| Comp. Ex. 4 | Ar | O2 | 0.25 | 9 | 87 | 36 | 16 | 11 | 7.3 | 0.8 |
| Comp. Ex. 5 | Ar/He | O2 | 0.25 | 9 | 85 | 35 | 18 | 10 | 7.3 | 0.6 |
| Comp. Ex. 6 | — | — | — | — | 81 | 160 | 3.0 | 13 | 7.3 | 1.1 |

Ex.: Example,
Com. Ex.: Comparative example

Example 11

The glass plate was subjected to atmospheric pressure plasma treatment to form a layer in the same manner as in Example 1 above, except that the composition of the gas used was changed as shown below.

| | |
|---|---|
| Inert gas: helium | 98.65% by volume |
| Reactive gas 1: hydrogen | 0.15% by volume |
| Reactive gas 2: bis(2,4-pentanedionato)zinc | 1.2% by volume |

Example 12

The glass plate was subjected to atmospheric pressure plasma treatment to form a layer in the same manner as in Example 1 above, except that the composition of the gas used was changed as shown below.

| | |
|---|---|
| Inert gas: helium | 98.65% by volume |
| Reactive gas 1: hydrogen | 0.15% by volume |
| Reactive gas 2: di-n-butyltin diacetate | 1.2% by volume |

Example 13

The glass plate was subjected to atmospheric pressure plasma treatment to form a layer in the same manner as in Example 1 above, except that the composition of the gas used was changed as shown below.

| | |
|---|---|
| Inert gas: argon | 98.65% by volume |
| Reactive gas 1: hydrogen | 0.15% by volume |
| Reactive gas 2: bis(2,4-pentanedionato)tin | 1.2% by volume |

Example 14

The glass plate was subjected to atmospheric pressure plasma treatment to form a layer in the same manner as in Example 1 above, except that the composition of the gas used was changed as shown below.

| | |
|---|---|
| Inert gas: helium | 98.65% by volume |
| Reactive gas 1: hydrogen | 0.14% by volume |
| Reactive gas 2: bis(2,4-pentanedionato)tin | 1.2% by volume |
| Reactive gas 3: carbon tetrafluoride | 0.01% by volume |

Example 15

The glass plate was subjected to atmospheric pressure plasma treatment to form a layer in the same manner as in Example 1 above, except that the composition of the gas used was changed as shown below.

| | |
|---|---|
| Inert gas: helium | 98.65% by volume |
| Reactive gas 1: hydrogen | 0.10% by volume |
| Reactive gas 2: tris(2,4-pentanedionato)indium | 1.2% by volume |
| Reactive gas 3: bis(2,4-pentanedionato)zinc | 0.5% by volume |

Example 16

The glass plate was subjected to atmospheric pressure plasma treatment to form a layer in the same manner as in Example 1 above, except that the composition of the gas used was changed as shown below.

| | |
|---|---|
| Inert gas: helium | 98.65% by volume |
| Reactive gas 1: hydrogen | 0.10% by volume |
| Reactive gas 2: tris(2,4-pentanedionato)indium | 1.2% by volume |
| Reactive gas 3: bis(2,4-pentanedionato)tin | 0.5% by volume |

Example 17

The glass plate was subjected to atmospheric pressure plasma treatment to form a layer in the same manner as in Example 1 above, except that the composition of the gas used was changed as shown below.

| | |
|---|---|
| Inert gas: helium | 98.65% by volume |
| Reactive gas 1: hydrogen | 0.10% by volume |
| Reactive gas 2: tris(2,2,6,6-tetramethyl-3,5-heptanedionato)indium | 1.2% by volume |
| Reactive gas 3: bis(2,4-pentanedionato)tin | 0.5% by volume |

Example 18

The glass plate was subjected to atmospheric pressure plasma treatment to form a layer in the same manner as in Example 1 above, except that the composition of the gas used was changed as shown below.

| | |
|---|---|
| Inert gas: helium | 98.65% by volume |
| Reactive gas 1: hydrogen | 0.10% by volume |
| Reactive gas 2: tris(2,4-pentanedionato)indium | 1.2% by volume |
| Reactive gas 3: tetrabutyltin | 0.5% by volume |

Example 19

The glass plate was subjected to atmospheric pressure plasma treatment to form a layer in the same manner as in Example 1 above, except that the composition of the gas used was changed as shown below.

| | |
|---|---|
| Inert gas: helium | 98.65% by volume |
| Reactive gas 1: hydrogen | 0.10% by volume |
| Reactive gas 2: triethylindium | 1.2% by volume |
| Reactive gas 3: di-n-butyltin diacetate | 0.5% by volume |

Comparative Example 7

A layer was formed on the glass plate prepared in Example 1 in the same manner as in Comparative example 1, except that zinc oxide was used as the sputtering target.

Comparative Example 8

A layer was formed on the glass plate prepared in Example 1 in the same manner as in Comparative example 1, except that tin oxide was used as the sputtering target.

Comparative Example 9

A layer was formed on the glass plate prepared in Example 1 in the same manner as in Comparative example 1, except that indium oxide and zinc oxide (indium oxide: zinc oxide=95:5) were used as the sputtering target.

Comparative Example 10

A layer was formed on the glass plate prepared in Example 1 in the same manner as in Example 11, except that hydrogen was changed to oxygen.

Comparative Example 11

A layer was formed on the glass plate prepared in Example 1 in the same manner as in Example 12, except that hydrogen was changed to oxygen.

Comparative Example 12

A layer was formed on the glass plate prepared in Example 1 in the same manner as in Example 13, except that hydrogen was changed to oxygen.

Comparative Example 13

A layer was formed on the glass plate prepared in Example 1 in the same manner as in Example 14, except that hydrogen was changed to oxygen.

Comparative Example 14

A layer was formed on the glass plate prepared in Example 1 in the same manner as in Example 15, except that hydrogen was changed to oxygen.

Comparative Example 15

A layer was formed on the glass plate prepared in Example 1 in the same manner as in Example 16, except that hydrogen was changed to oxygen.

Comparative Example 16

A layer was formed on the glass plate prepared in Example 1 in the same manner as in Example 17, except that hydrogen was changed to oxygen.

Examples 11 through 19 and Comparative examples 7 through 16 were evaluated for layer forming speed, transmittance and resistivity in the same manner as in Example 1. The results are shown in Table 2.

In Table 2, $In(AcAc)_3$ represents tris(2,4-pentanedionato)indium, $Zn(AcAc)_2$ represents bis(2,4-pentanedionato)zinc, DBTDA represents di-n-butyltin diacetate, tris(2,4-pentanedionato)indium, $Sn(AcAc)_2$ represents bis(2,4-pentanedionato)tin, $In(C_2H_5)_3$ represents triethylindium, TBT represents tetrabutyltin, $In(TMHD)_3$ represents tris(2,2,6,6-tetramethyl-3,5-heptanedionato)indium.

TABLE 2

|  | Reactive gas 1 | Reactive gas 2 | Reactive gas 3 | Layer forming speed (nm/min) | Transmittance (%) | Resistivity ($10^{-4}$ Ω·cm) |
|---|---|---|---|---|---|---|
| Ex. 11 | H2 | $Zn(AcAc)_2$ | — | 13 | 89 | 13 |
| Ex. 12 | H2 | DBTDA | — | 10 | 87 | 14 |
| Ex. 13 | H2 | $Sn(AcAc)_2$ | — | 12 | 88 | 9.7 |
| Ex. 14 | H2 | $Sn(AcAc)_2$ | $CF_4$ | 12 | 87 | 6.9 |
| Ex. 15 | H2 | $In(AcAc)_3$ | $Zn(AcAc)_2$ | 13 | 90 | 4.2 |
| Ex. 16 | H2 | $In(AcAc)_3$ | $Sn(AcAc)_2$ | 14 | 92 | 3.2 |
| Ex. 17 | H2 | $In(TMHD)_3$ | $Sn(AcAc)_2$ | 13 | 91 | 2.8 |
| Ex. 18 | H2 | $In(AcAc)_3$ | TBT | 9 | 85 | 5.1 |
| Ex. 19 | H2 | $In(C_2H_5)_3$ | DBDTA | 8 | 86 | 5.8 |
| Comp. Ex. 7 | — | — | — | 0.4 | 88 | 16 |
| Comp. Ex. 8 | — | — | — | 0.3 | 86 | 19 |
| Comp. Ex. 9 | — | — | — | 0.3 | 89 | 6.2 |
| Comp. Ex. 10 | O2 | $Zn(AcAc)_2$ | — | 13 | 72 | 111 |
| Comp. Ex. 11 | O2 | DBDTA | — | 12 | 77 | 42 |
| Comp. Ex. 12 | O2 | $Sn(AcAc)_2$ | — | 14 | 74 | 36 |
| Comp. Ex. 13 | O2 | $Sn(AcAc)_2$ | $CF_4$ | 12 | 71 | 28 |
| Comp. Ex. 14 | O2 | $In(AcAc)_3$ | $Zn(AcAc)_2$ | 12 | 79 | 42 |
| Comp. Ex. 15 | O2 | $In(AcAc)_3$ | $Sn(AcAc)_2$ | 15 | 92 | 38 |
| Comp. Ex. 16 | O2 | $In(TMHD)_3$ | $Sn(AcAc)_2$ | 15 | 91 | 24 |

Ex.: Example,
Com. Ex.: Comparative example

Example 20

The same procedures as Example 1 was carried out, except that an amorphous cyclopolyolefin resin film with a thickness of 100 μm (ARTON film produced by JSR Co., Ltd.) was used as the substrate and a plasma discharge treatment apparatus as shown in FIG. 6 was used. Thus, a tin doped indium oxide layer was formed on the amorphous cyclopolyolefin resin film, and evaluated for layer forming speed, transmittance and resistivity in the same manner as in Example 1.

Critical radius of curvature was measured according to the following procedures:

<Measurement of Critical Radius of Curvature)

Sample 20 with a tin doped indium oxide layer as prepared in Example 1 was cut into a 10 cm square specimen. Surface resistance RO of the resulting specimen was measured at 20° C. and 60% RH employing Loresta-GP, MCP-T600 produced by Mitsubishi Chemical Corporation. Next, the specimen was closely wound around a stainless steel rod with a radius 10 mm, and allowed to stand for 3 minutes. After that, the specimen was unwound and surface resistance R thereof was measured in the same manner as above. Surface resistance R was measured in the same manner as above, except that a rod with a radius reduced 1 mm by 1 mm was used. The radius of a rod giving a ratio R/RO exceeding 1 was defied as critical radius of curvature.

Example 21

The same procedures as Example 20 were carried out, except that Zeonor ZF16 with a thickness of 100 μm produced by Nippon Zeon Co., Ltd. was used as the substrate. Thus, a tin doped indium oxide layer was formed on the Zeonor ZF16, and evaluated in the same manner as in Example 20.

Example 22

The same procedures as Example 20 were carried out, except that a polycarbonate film with a thickness of 100 μm, Pureace produced by Teijin Co., Ltd. was used as the substrate. Thus, a tin doped indium oxide layer was formed on the film, and evaluated in the same manner as in Example 20.

Example 23

The same procedures as Example 20 were carried out, except that an acetylcellulose film with a thickness of 100 μm, Pureace produced by Teijin Co., Ltd. was used as the substrate. Thus, a tin doped indium oxide layer was formed on the film, and evaluated in the same manner as in Example 20.

Comparative Example 17

A tin doped indium oxide layer was formed on a polyethylene terephthalate film employing a take-up type magnetron sputtering apparatus in which a vacuum chamber, a sputtering target and an air introducing tube were provided. The film was introduced in the vacuum chamber of the apparatus, and the pressure in the chamber was reduced to $4 \times 10^{-4}$ Pa. As the sputtering target, a composition comprised of indium oxide and tin oxide (indium oxide: tin oxide=95:5) was used. After that, the film was rewound and the chamber was degassed. Subsequently, a mixed gas of argon and oxygen ($Ar:O_2$=98.8:

1.2) was introduced in the vacuum chamber till pressure in the chamber reached $1 \times 10^{-3}$ Pa, and a power density of 1 W/cm² was applied at a film transporting speed of 0.1 m/min and at a main roll temperature of 100° C. to form a layer on the film. The formed layer was evaluated in the same manner as in Example 20.

The evaluation results of Examples 20 through 23 and comparative example 17 are collectively shown in Table 3.

TABLE 3

| | Layer forming speed (nm/min) | Transmittance (%) | Resistivity ($10^{-4}$ Ω · cm) | Critical radius of curvature (mm) |
|---|---|---|---|---|
| Ex. 20 | 12 | 87 | 4.0 | 6 |
| Ex. 21 | 13 | 86 | 4.6 | 5 |
| Ex. 22 | 12 | 84 | 4.9 | 6 |
| Ex. 23 | 11 | 87 | 4.2 | 5 |
| Comp. Ex. 17 | 0.3 | 84 | 4.9 | 7 |

Ex.: Example,
Com. Ex.: Comparative example

Transparent conductive layers of examples 24, 25 and 26 were prepared according to the following procedures.

Example 24

Employing a planar plasma discharge treatment apparatus shown in FIG. 7, a transparent conductive layer was formed on the substrate in the same manner as in Example 1, except that conditions as shown below were used.

Electric field conditions:

| Electric field conditions: frequency: 13.56 MHz, output density: 5 W/cm² Gas composition | |
|---|---|
| Inert gas: helium | 98.74% by volume |
| Reactive gas 1: hydrogen | 0.15% by volume |
| Reactive gas 2: Indium acetylacetonate | 1.2% by volume |
| Reactive gas 3: dibutyltin diacetate | 0.5% by volume |

Example 25

A transparent conductive layer (ITO layer) was formed on the substrate in the same manner as in Example 24, except that the gas composition as shown below was used.

| Gas composition | |
|---|---|
| Inert gas: helium | 98.60% by volume |
| Reactive gas 1: hydrogen | 0.15% by volume |
| Reactive gas 2: Indium acetylacetonate | 1.2% by volume |
| Reactive gas 3: dibutyltin diacetate | 0.5% by volume |

Example 26

A transparent conductive layer was formed on a substrate employing the atmospheric pressure plasma discharge treatment disclosed in Example 3 of Japanese Patent O.P.I. Publication No. 2000-303175, except that the substrate and electrodes in Examples 24 and 25 were used, and electric field conditions and the gas as shown below were used.

| (Electric field conditions) frequency: 10 kHz, output density: 0.8 W/cm² (PHF-4K produced by Heiden Kenkyusho) (Gas composition) | |
|---|---|
| Inert gas: helium | 98.75% by volume |
| Reactive gas 1: hydrogen | 0.5% by volume |
| Reactive gas 2: Indium acetylacetonate | 1.2% by volume |
| Reactive gas 3: dibutyltin diacetate | 0.05% by volume |

Regarding the resulting transparent conductive layers, coefficient of variation of H/M in the thickness direction and the hydrogen concentration were determined according to the dynamic SIMS as described above. Further, resistivity and light transmittance were measured. The results are shown in Table 4.

TABLE 4

| | Inert gas | Reactive gas 1 | Concentration of reactive gas 1 (% by volume) | Coefficient of variation of ratio H/M (%) | Hydrogen concentration (atomic %) | Resistivity (Ω · cm) | Transmittance (%) |
|---|---|---|---|---|---|---|---|
| Ex. 24 | He | $H_2O$ | 0.01 | 2.8 | 1.0 | $2 \times 10^{-4}$ | 90 |
| Ex. 25 | He | $H_2$ | 0.15 | 1.5 | 0.8 | $2 \times 10^{-4}$ | 91 |
| Ex. 26 | He | $H_2$ | 0.5 | 5.3 | 1.3 | $3.9 \times 10^{-4}$ | 80 |

Ex.: Example

As is apparent from Table 4 above, it has been confirmed that the transparent conductive layer having a coefficient of variation of ratio H/M in the thickness direction of not more than 5% further improves performances of the transparent conductive layer.

The present invention provides a method of forming a transparent conductive layer with good optical and electric properties, a method of forming a transparent conductive layer with good critical radius of curvature on a substrate, and a method of forming a transparent conductive layer with high safety and with high productivity, and provides a transparent conductive layer formed according to the above-mentioned method and a material comprising the transparent conductive layer.

What is claimed is:

1. A transparent conductive layer forming method comprising the steps of:
    introducing a reactive gas to a discharge space;
    exciting the reactive gas in a plasma state by discharge at atmospheric pressure or at approximately atmospheric pressure; and
    exposing a substrate to the reactive gas in a plasma state to form a transparent conductive layer on the substrate, wherein the reactive gas comprises a reducing gas.
2. The transparent conductive layer forming method of claim 1, wherein the reducing gas is hydrogen.
3. The transparent conductive layer forming method of claim 1, wherein the reactive gas comprises at least one gas selected from gases derived from organometallic compounds.
4. The transparent conductive layer forming method of claim 1, wherein the method comprises the step of introducing a mixed gas of the reactive gas and inert gas to the discharge space, the inert gas comprising argon or helium.
5. The transparent conductive layer forming method of claim 4, wherein the content of the reducing gas in the mixed gas is 0.0001 to 5.0% by volume.
6. The transparent conductive layer forming method of claim 4, wherein the mixed gas to be introduced to the discharge space contains no oxygen.
7. The transparent conductive layer forming method of claim 1, wherein an output density of not more than 100 W/cm$^2$ is applied at a frequency of not less than 0.5 kHz across the discharge space.
8. The transparent conductive layer forming method of claim 7, wherein an output density of not less than 1 W/cm$^2$ is applied at a frequency exceeding 100 kHz across the discharge space.
9. The transparent conductive layer forming method of claim 1, wherein temperature of the surface of the substrate, on which the transparent conductive layer is formed, is not more than 300° C.

* * * * *